United States Patent [19]

Nakaizumi

[11] Patent Number: 4,878,201
[45] Date of Patent: Oct. 31, 1989

[54] SEMICONDUCTOR MEMORY DEVICE HAVING AN IMPROVED TIMING SIGNAL GENERATOR FOR THE COLUMN SELECTION CIRCUIT

[75] Inventor: Kazuo Nakaizumi, Tokyo, Japan

[73] Assignee: NEC Corporation, Tokyo, Japan

[21] Appl. No.: 149,269

[22] Filed: Jan. 28, 1988

[30] Foreign Application Priority Data

Jan. 28, 1987 [JP] Japan .................................. 62-19298
Jan. 28, 1987 [JP] Japan .................................. 62-19303

[51] Int. Cl.$^4$ .................... G11C 7/00; G11C 11/40
[52] U.S. Cl. ................................ 365/203; 365/226; 365/189.11; 365/189.09
[58] Field of Search .......... 365/203, 204, 226, 189.09, 365/189.11; 307/530

[56] References Cited

U.S. PATENT DOCUMENTS

| | | | |
|---|---|---|---|
| 4,636,981 | 1/1987 | Ogura .................................. | 365/226 |
| 4,733,371 | 4/1988 | Terada et al. ........................ | 365/226 |
| 4,748,349 | 5/1988 | McAlexander et al. ............ | 365/205 |
| 4,750,155 | 6/1988 | Hsieh .............................. | 365/203 X |
| 4,751,679 | 6/1988 | Dehganpour ........................ | 365/230 |
| 4,752,699 | 6/1988 | Cranford, Jr. et al. ............. | 365/226 |
| 4,767,950 | 8/1988 | Schrenk .............................. | 365/226 |
| 4,769,784 | 9/1988 | Dowca et al. ....................... | 365/226 |
| 4,769,792 | 9/1988 | Nogami et al. ...................... | 365/203 |
| 4,780,854 | 10/1988 | Watanake et al. ................... | 365/226 |

Primary Examiner—Stuart N. Hecker
Assistant Examiner—Alfonso Garcia
Attorney, Agent, or Firm—Sughrue, Mion, Zinn, MacPeak & Seas

[57] ABSTRACT

A drive timing signal generator for generating a drive timing signal used for driving transfer gate transistors in a memory device, is disclosed. The generator includes a boost circuit for operative generating a boosted voltage above the power voltage and an additional boost circuit for further boosting the boosted voltage generated by the boost circuit after the generation of the boosted voltage in a write mode.

4 Claims, 6 Drawing Sheets

SEMICONDUCTOR MEMORY DEVICE HAVING AN IMPROVED TIMING SIGNAL GENERATOR FOR THE COLUMN SELECTION CIRCUIT

BACKGROUND OF THE INVENTION

The present invention relates to a semiconductor memory device, and more particular to a timing signal generator for column selection in a dynamic type semiconductor memory device.

A dynamic memory device is structured such that a plurality of memory cells are arranged in a matrix form of rows with word lines and columns with a plurality of pairs of digit lines and a plurality of sense amplifiers are provided for the plurality of pairs of digit lines. The plurality of pairs of digit lines are coupled to a pair of data bus lines through a plurality of pairs of column selection transfer gates, respectively. Each pair of transfer gates are controlled by a column decode signal generated by a column decoder. The column decoder is generally composed of NOR gate receiving column address signals, a source-follower transistor and a coupling transistor coupled between an output of the NOR gate and a gate of the source follower transistor. The drain of source-follower transistor is supplied with a drive timing signal and the decode signal for controlling the transfer gates is derived from the source of the source-follower transistor. The drive timing signal is generated in response to an externally applied chip enable signal ($\overline{CE}$) and takes a boosted level higher than a power voltage $V_{cc}$. Therefore, the column selection transfer gates are rendered conductive in the non-saturated, triode region so that signal transfer between the data bus lines and the bit lines is effectively performed.

However, the above drive timing signal is generated by a known boot-strap circuit and the drive timing signal is capacitively boosted above $V_{cc}$. Thus, the drive timing signal has a large internal impedance and its boosted level above $V_{cc}$ gradually falls.

Furthermore, it is common that wiring for carrying the drive timing signal has a plurality of crossing points with other signal wirings such as the data bus lines.

Accordingly, it is difficult to effectively achieve the Read-Modify-Write cycle, in which a read operation is performed on a selected address and immediately thereafter a write operation is made on the same selected address. In this cycle, the drive timing signal is produced during a relatively long period and hence its boosted level inevitably falls below $V_{cc}$ in the write operation due to leakage of the boosted charge and coupling of the drive timing signal wiring with other wirings. As a result, in the write operation, the level of the drive timing signal is nor more at the boosted level above $V_{cc}$ but is lower than $V_{cc}$ and therefore the column selection transfer gates are made conductive in the saturated region and their effective conductances are small. Thus, it is difficult to write new data to the selected address through the transfer gates conductive in the saturated region, resulting in failure in changing data stored in the selected address through the transfer gates.

SUMMARY OF THE INVENTION

It is one object of the present invention to provide a semiconductor memory device which can read one data from a selected address and thereafter write the other data to the same selected address stably.

It is another object to provide a semiconductor memory device provided with an improved timing signal generator which can produce a drive timing signal having the boosted level above $V_{cc}$ over the entire Read-Modify-Write cycle.

The drive timing signal generator according to the invention comprises an output terminal, means receiving a power voltage, a first drive circuit coupled to the output terminal, the first drive circuit making the output terminal approximately at the potential of the power voltage in response to a first timing signal, and a first capacitive boost circuit coupled to the output terminal, the first capacitive boost circuit raising the potential at the output terminal which has been made approximately at the potential of the power voltage, above the power voltage in response to a second timing signal, the second timing signal being generated after the generation of the first timing signal, and a second capacitive boost circuit coupled to the output terminal, the second capacitive boost circuit operatively raising the potential at the output terminal above the power voltage in response to a third timing signal which is generated in a write mode and after generation of the second timing signal.

DETAILED DESCRIPTION OF THE INVENTION

Figure 1:
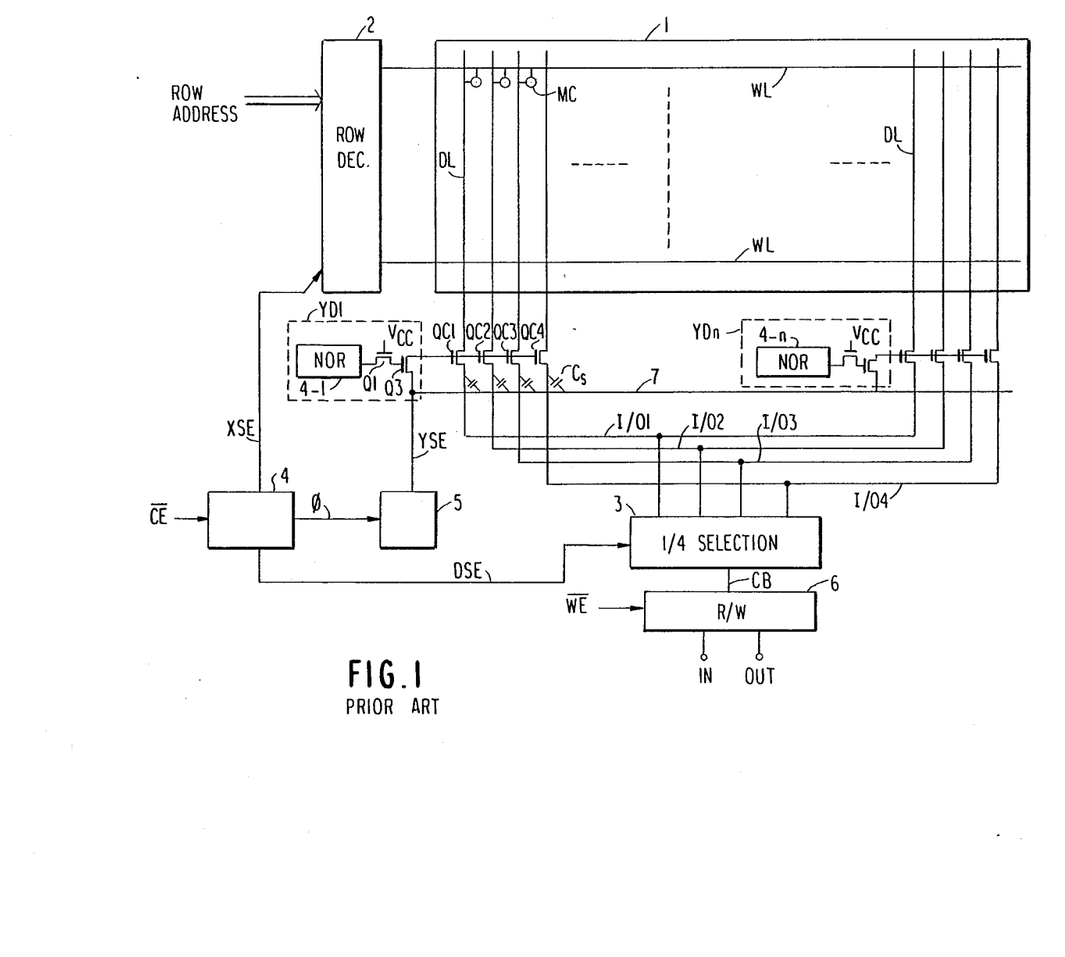
FIG. 1 is a schematic block diagram of a semiconductor memory device according to prior art.

Referring to FIG. 1, the general structure of a semiconductor memory device is explained.

A memory cell array 1 includes a plurality of word lines WL arranged in rows, a plurality of digit lines DL arranged in columns and a plurality of memory cells MC. A row decoder 2 receives row address signals and operatively selects one of the word lines WL. The digit lines are classified into a plurality of groups each including four consecutive digit lines. Each group of digit lines DL are coupled to four data bus lines I/O 1–I/O 4 through four column selection transfer gates such as shown QC1–QC4. The transfer gates QC1–QC4 . . . are controlled by column decoder units YD1–YDn. The column decoder unit YD1 is composed of a NOR gate 4-1 receiving column address signals, a coupling transistor $Q_1$ and a source-follower transistor $Q_3$. The source-follower transistor $Q_3$ receives at its drain a drive timing signal YSE which is generated by a drive timing signal generator 5. The drive timing signal YSE is also applied to the source-follower transistors $Q_3$ of other decoder units via a wiring 7 extending in the column direction across the data bus lines I/O 1–I/O 4. There are stray capacitances $C_S$ between the wiring 7 and the respective data bus lines. The drive timing signal generator 5 is a boot-strap circuit and the signal YSE is capacitively boosted above $V_{cc}$. A bus selection circuit 3 selectively establishes a signal path between a common bus line CB and one of the data bus lines. The common bus line CB is connected to a read/write circuit 6 which is controlled between a read mode and a write mode in response to a read-write control signal $\overline{WE}$. A timing control circuit 4 receives a chip enable signal $\overline{CE}$ and generates control signals XSE, $\phi$ and DSE in a predetermined order for enabling the row decoder 2, the generator 5 and the selection circuit 3, respectively.

As is well known in the art, the boosted level of the signal YSE gradually falls according to time elapse and therefore it is difficult to maintain the level of the signal YSE above $V_{cc}$ for a long period. Furthermore, the level of YSE is affected by the levels of the data bus lines I/O 1–I/O 4 via stray capacitances $C_S$. Therefore, after read out, signals from the four digit lines DL are transferred to the data bus lines I/O 1–I/O 4 and change in level at the data bus lines further lowers the level of YSE. Thus, the conductance of the selected transfer gates (QC1–QC4) is lowered. Under the above condition of the transfer gates, when a write operation is initiated, different write data signals are applied to the data bus lines I/O 1–I/O 4 via the read/write circuit 6. However, the conductance of the transfer gates is small and it is difficult to write new data to the digit lines DL via the transfer gates at a high speed.

Figure 2:
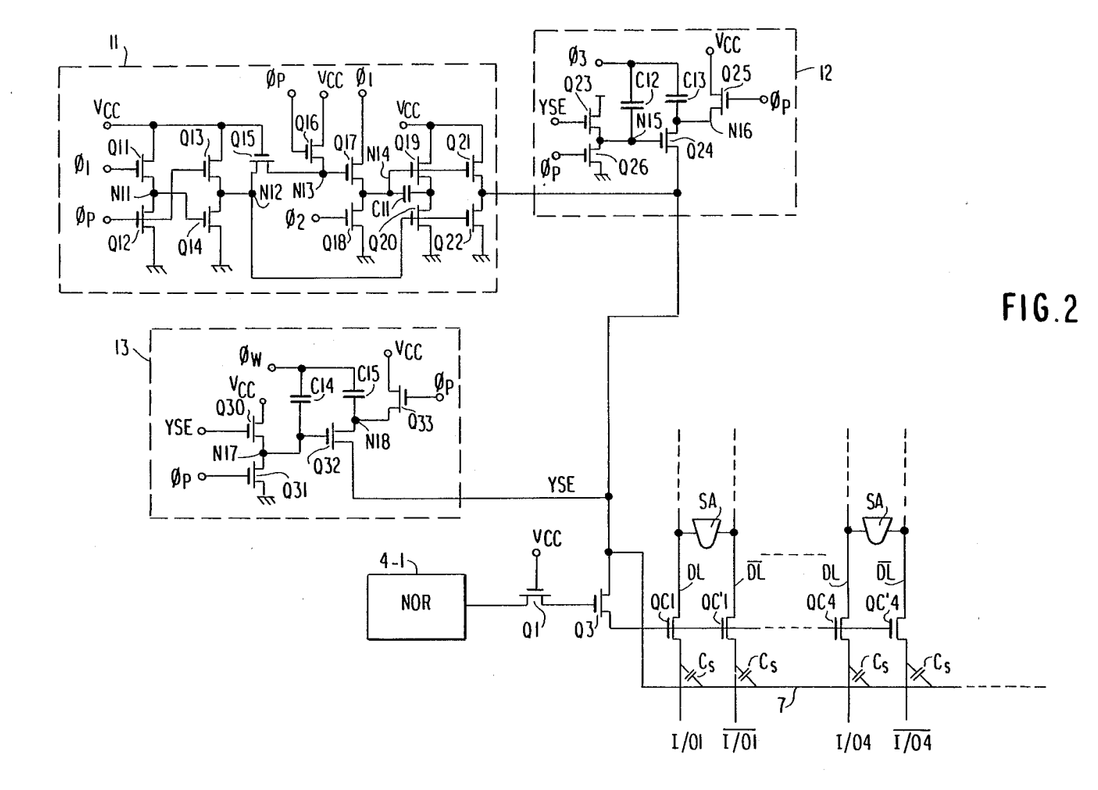
FIG. 2 is a schematic circuit diagram of a drive timing signal generator according to a first embodiment of the invention.

Referring to FIG. 2, a drive timing signal generator 5 according to the first embodiment of the invention is explained. In FIG. 2, the portions or elements corresponding to those in FIG. 1 are denoted by similar or same references.

In FIG. 2, a pair of digit lines DL and $\overline{DL}$ are provided for each column and the data bus lines I/O 1, $\overline{I/O}$ 1–I/O 4, $\overline{I/O}$ 4 and transfer gates QC1, $\overline{QC'1}$–QC4, $\overline{QC'4}$ are provided in balanced manner to accord with the pairs of digit lines. A flip-flop type sense amplifier SA is provided to each pair of digit lines.

The drive timing signal generator 5 is basically composed of a boot-strap circuit 11, a first capacitive pull-up circuit 12 and a second capacitive pull-up circuit 13. The boot-strap circuit 11 is composed of N-channel field effect transistors (N-MOSTs) $Q_{11}$ to $Q_{22}$ and a boot capacitor $C_{11}$ and generates an output signal of $V_{cc}$ through N-MOST $Q_{21}$ in response to a precharge signal $\phi_p$, and timing signals $\phi_1$ and $\phi_2$ which are generated in response to the chip enable signal $\overline{CE}$. The first capacitive pull-up circuit 12 is composed of N-MOSTs $Q_{23}$ to $Q_{26}$ and pull-up capacitors $C_{12}$ and $C_{13}$, and further raises the $V_{cc}$ level output of the boot-strap circuit 11 above $V_{cc}$ thereby to generate the boosted level of YSE, in response to a timing signal $\phi_3$ generated in accordance with $\overline{CE}$.

The second boot circuit 13 is composed of N-MOSTs $Q_{30}$ to $Q_{33}$ and boost capacitors $C_{14}$ and $C_{15}$. The circuit 13 receives the precharge signal $\phi_p$ and a write timing signal $\phi_W$ which is generated in a write operation. The circuit 13 further boosts the level of YSE in the write operation in response to the rise of $\phi_W$.

Figure 3:
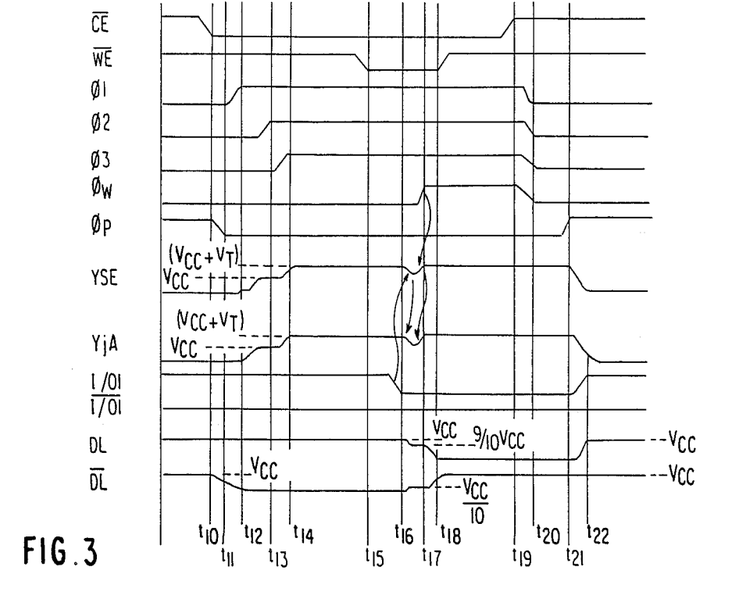
FIG. 3 is a timing chart showing operation of the circuit of FIG. 2.

Referring to FIG. 3, operation of the circuit of FIG. 2 is explained.

The chip enable signal $\overline{CE}$ is changed to the low ("0") level at a time point $t_{10}$ to enable the memory for access. Then the precharge signal $\phi_p$ is fallen to the low level (ground level) at $t_{11}$. Then, the timing signal $\phi_1$ is raised to the high level at $t_{12}$ to enable the circuit 11. The N-MOSTs $Q_{20}$ and $Q_{22}$ are turned off and the potential at $N_{14}$ is raised above $eV_{cc}$. Thus, the signals YSE and YjA are raised to $V_{cc}$. The timing signal $\phi_2$ is then raised at a time point $t_{13}$ to $V_{cc}$ level to make N-MOST $Q_{18}$ conductive so that the level at node 14 is lowered and N-MOSTs $Q_{19}$ to $Q_{22}$ are made non-conductive. As a result, the $V_{cc}$ level of YSE is maintained under a high impedance, floating state.

AT a time point $t_{14}$, the timing signal $\phi_3$ is raised to $V_{cc}$ level so that nodes $N_{16}$ and $N_{17}$ are raised above $V_{cc}$ through capacitors $C_{12}$ and $C_{13}$. As a result, the level of YSE is raised to $V_{cc}+VT$ (VT being a threshold voltage of N-MOSTs) or more, and the signal YjA is also raised to $V_{cc}+VT$ or more. Accordingly, transfer gate MOSTs $QC_1$, $QC'_1$–$QC_4$, $QC'_4$ are rendered conductive in the non-saturated, triode region thereby to provide large conductances between the four pairs of digit lines DL, $\overline{DL}$ and four pairs of bus lines I/O 1, $\overline{I/O}$ 1–I/O 4, $\overline{I/O}$ 4 so that read signals on the above digit lines are transferred to the data bus lines for outputting read information.

Then, at a time point $t_{15}$, the read/write control signal $\overline{WE}$ is changed to the low level and a write operation is initiated with respect to the same address on which the previous read operation has achieved. At a time point $t_{16}$, new data (low) signal is applied to the data bus line I/O 1 which has been at the high level. This change in potential at I/O 1 is transmitted to the signal YSE through the stray capacitances $C_S$ to lower the level of YSE. In this instance, in the case where the sum of four stray capacitances $C_S$ is about one-third of the total capacitance of YSE and YjA, the levels of YSE and YjA are fallen from $(V_{cc}+VT)$ to $(V_{cc}-VT)$ or less and the current flowing ability, i.e. conductance of the transfer gate N-MOSTs $QC_1$, $QC'_1$–$QC_4$, $QC'_4$ is remarkably reduced to the extent that inverting a state of the sense amplifier by the level of I/O 1 is difficult. Assuming that the current flowing ability of the transfer gate N-MOSTs $QC_1$, $QC'_1$–$QC_4$, $QC'_4$ is one-tenth of that of N-MOSTs forming a flip-flop of the sense amplifier SA, the levels of the digit lines DL and $\overline{DL}$ become 9/10 $V_{cc}$ and 1/10 $V_{cc}$, respectively.

The timing signal $\phi_W$ is activated to the high level at $t_{17}$ so that the circuit 13 boosts the level of YSE above $(V_{cc}+VT)$ by the capacitive boost due to the capacitor $C_{14}$ and $C_{15}$. As a result, the column decode signal YjA is again boosted to the level of $(V_{cc}+VT)$ or more so that the transfer gate N-MOSTs $QC_1$, $QC'_1$–$QC_4$, $QC'_4$ are conductive in the non-saturated, triode region. Thus, the data bus lines I/O 1, $\overline{I/O}$ 1–I/O 4, $\overline{I/O}$ 4 are connected to the four pairs of digit lines DL, $\overline{DL}$ via the large conductance of N-MOSTs $QC_1$, $QC'_1$–$QC_4$, $QC'_4$ and the states of the sense amplifiers SA are easily inverted according to the new write data through the digit lines DL and $\overline{DL}$ which are set to D and $V_{cc}$ levels, respectively.

At $t_{19}$, $\overline{CE}$ is reset to the high level and the signals $\phi_1$–$\phi_3$ and $\phi_W$ are all changed to the low level at $t_{20}$. At $t_{21}$, the precharge signal $\phi_p$ is raised and the digit lines DL, $\overline{DL}$ are precharged to terminate the operation.

Figure 4:
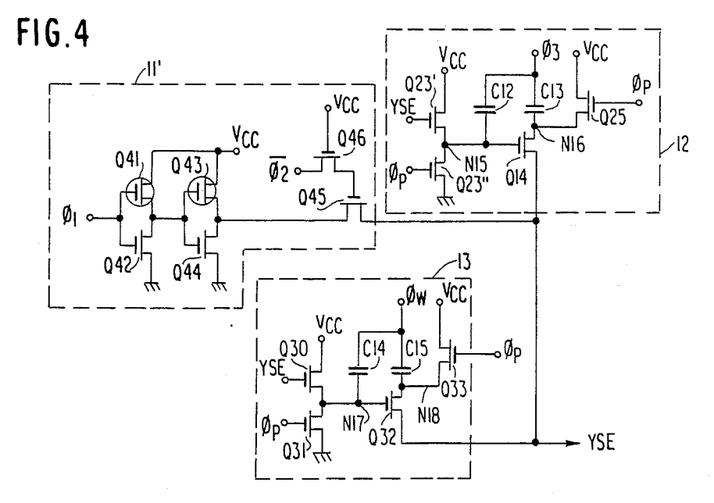
FIG. 4 is a schematic circuit diagram of a drive timing signal generator according to a second embodiment of the present invention.

Referring to FIG. 4, a drive timing signal generator according to a second embodiment of the invention is features by a CMOS buffer circuit 11', in place of the boot-strap circuit 11 in FIG. 2. The CMOS buffer circuit 11' is composed of P-channel MOSTs (P-MOSTs) $Q_{41}$, $Q_{43}$ and N-MOSTs $Q_{42}$, $Q_{44}$ to $Q_{46}$. In the circuit 11', in place of the timing signal $\phi_2$ of FIG. 2, its opposite signal $\overline{\phi_2}$ is employed to make the output of the circuit 11' at the high level, high impedance state when $\overline{\phi_2}$ is made low in level.

Figure 5:
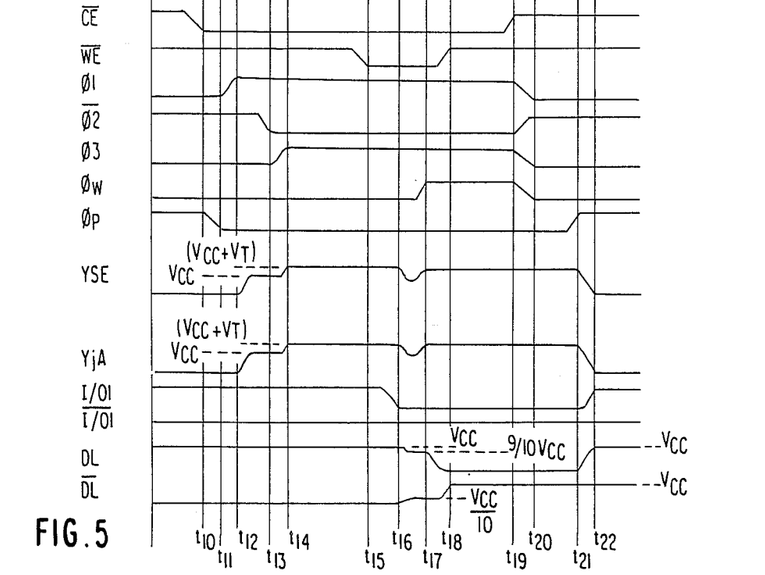
FIG. 5 is a timing chart of operation of the circuit of FIG. 4.

Operation of the circuit of FIG. 4 is illustrated in FIG. 5. The only difference with respect to the embodiment of FIG. 2 resides in the above-mentioned timing signal $\overline{\phi_2}$.

Figure 6:
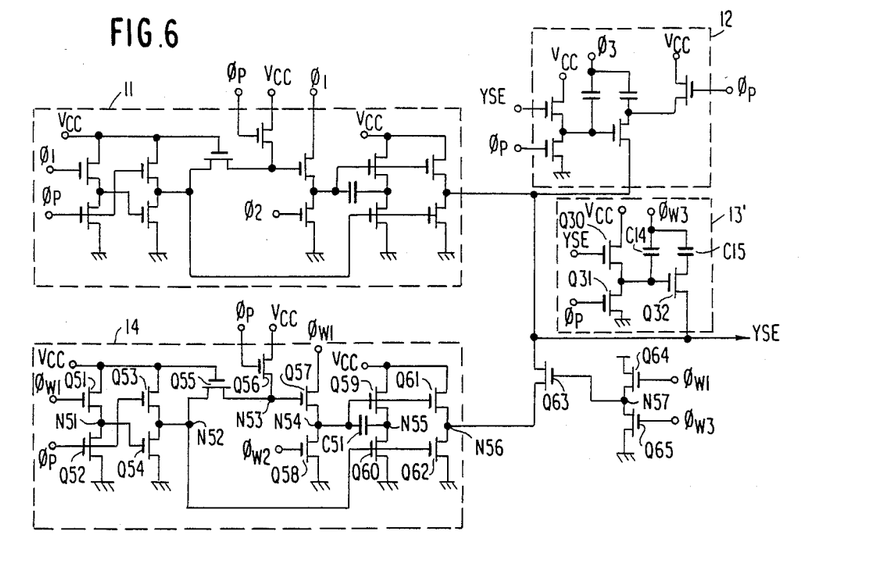
FIG. 6 is a schematic circuit diagram of a drive timing signal generator according to a third embodiment of the invention.

Referring to FIG. 6, a drive timing signal generator according to a third embodiment of the invention is featured by a write timing boot-strap circuit 14 and a coupling control circuit composed of N-MOSTs $Q_{63}$–$Q_{65}$. Also in place of $\phi_W$, three sequentially generated write timing signals $\phi_{W1}$–$\phi_{W3}$ are employed. The circuit 14 is composed of N-MOSTs $Q_{51}$ to $Q_{62}$ and a capacitor $C_{51}$ and has the similar circuit structure to the circuit 11. The circuit 14 produces the output of $V_{cc}$ level at a node N56 in response to the high level of $\phi_{W1}$ and renders the high level output at the high impedance, floating state. The high level of the output at the node N56 is transmitted to the outputs of the circuits 11, 12 and 13' via N-MOSFET $Q_{63}$ made conductive in response to $\phi_{W1}$ via $Q_{64}$. Then, when 100 $_{W3}$ goes to high in level, N-MOST $Q_{65}$ becomes conductive to make N-MOST $Q_{63}$ non-conductive so that the node N56 is isolated from the outputs (YSE) of the circuits 11, 12 and 13'. In response to the rise $\phi_{W3}$, the circuit 13' capacitively boosts the level of YSE above ($V_{cc}$ +VT).

Figure 7:
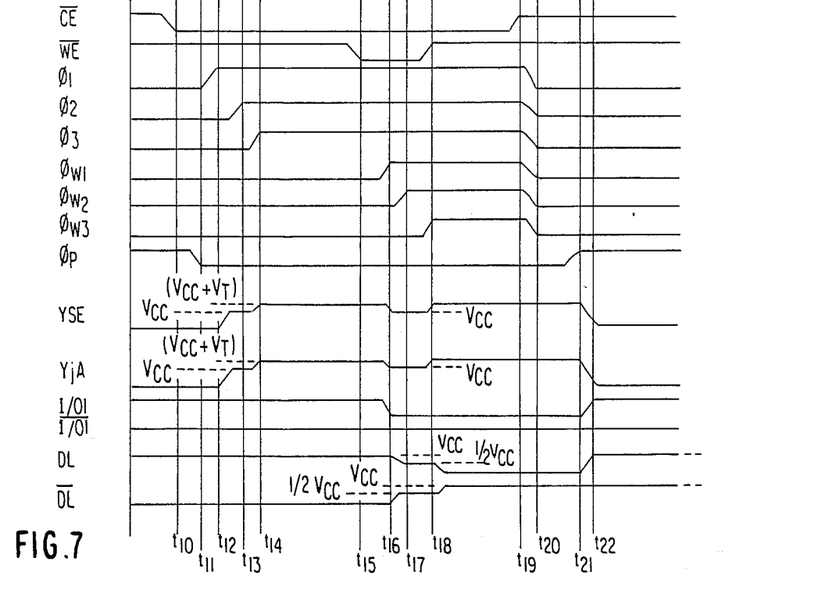
FIG. 7 is a timing chart showing operation of the circuit of FIG. 6.

Operation of the circuit of FIG. 6 is illustrated in FIG. 7. As is apparent from FIG. 7, after WE goes to the low level at $t_{15}$, the timing signals $\phi_{W1}$, $\phi_{W2}$ and $\phi_{W3}$ are sequentially produced at $t_{16}$, $t_{17}$ and $t_{18}$ respectively to boost YSE.

Figure 8:
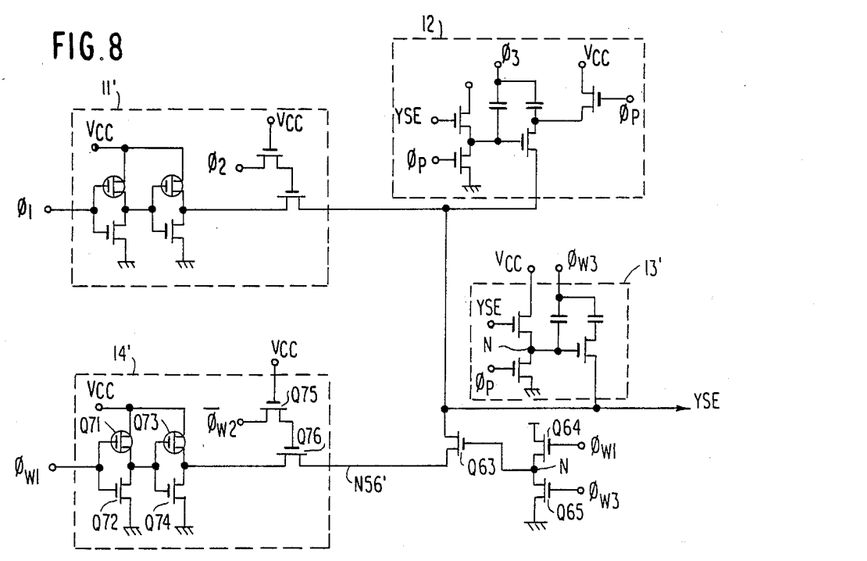
FIG. 8 is a schematic circuit diagram of a drive timing signal generator according to a fourth embodiment of the present invention.

FIG. 8 shows a drive timing signal generator according to a fourth embodiment of the invention. This embodiment is obtained by adding a write timing CMOS buffer 14' and the coupling control circuit composed of N-MOSTs $Q_{63}$–$Q_{65}$ to the embodiment of FIG. 4.

The CMOS buffer 14' generates the $V_{cc}$ level at the node N56' in response to the high level of $\phi_{W1}$ and renders the high level at the node N56' at the high impedance, floating state in response to the low level of $\overline{\phi_{W2}}$ which is opposite to $\phi_{W2}$.

Figure 9:
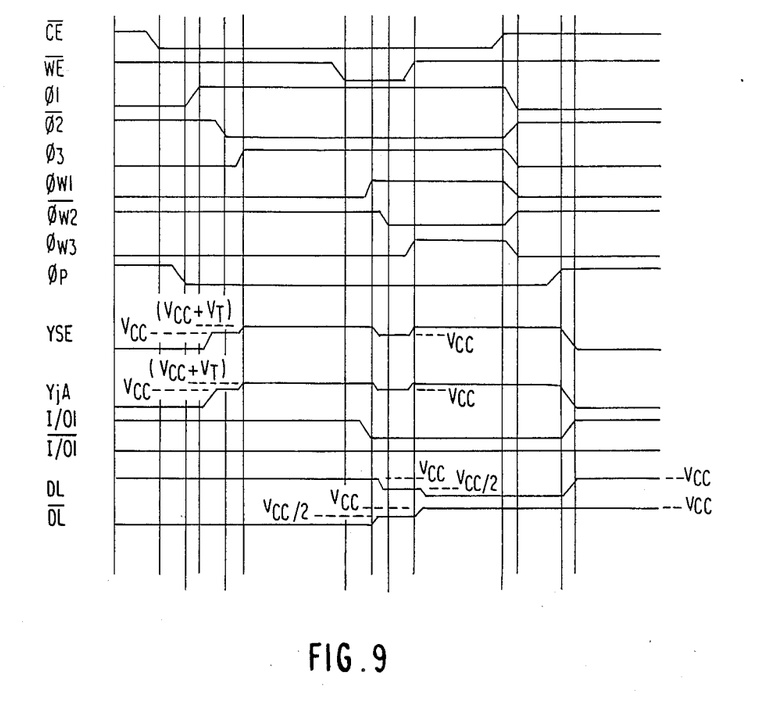
FIG. 9 is a timing chart showing operation of the circuit of FIG. 8.

Operation of the circuit of FIG. 8 is similarly understood from FIG. 9.

As has been explained above, the present invention advantageously produces a boosted level of drive timing signal for a long period, particularly for a write period subsequent to a read period.

I claim:

1. A memory device comprising an output terminal, means receiving a power voltage, a first drive circuit coupled to said output terminal, said first drive circuit making said output terminal approximately the potential of said power voltage in response to a first timing signal, a first capacitive boost circuit coupled to said output terminal, said first capacitive boost circuit raising the potential at said output terminal, which is approximately at the potential of said power voltage, above said power voltage in response to a second timing signal, said second timing signal being generated after the generation of said first timing signal, and a second capacitive boost circuit coupled to said output terminal, said second capacitive boost circuit operatively raising the potential at said output terminal above said power voltage in response to a third timing signal, said third timing signal being generated only in a write mode and after generation of said second timing signal.

2. The device according to claim 1, further comprising a second drive circuit coupled to said output terminal for operatively raising the potential at said output terminal above said power voltage after generation of said second timing signal but before the generation of said third timing signal only in the write mode.

3. The device according to claim 1, in which said second capacitive boost circuit includes a field effect transistor having a current path coupled between said output terminal and a first node, a first capacitor coupled between a second node and a gate of said field effect transistor a second capacitor coupled between said first node and said second node, and means for applying said third timing signal to said second node.

4. A semiconductor memory device comprising a plurality of word lines, a plurality of digit lines, a plurality of memory cells coupled to said word lines and said digit lines, at least one data bus line, a plurality of transfer gate field effect transistors coupled between said digit lines at said at least one data bus line, a row decoder coupled to said word lines for slecting one of said word lines, and a column decoder coupled to gates of said transfer gate field effect transistors for making a part of said transfer gate field effect transistors conductive, said column decoder including a logic gate receiving addess information, a source-follower transistor, means for connecting a source of said source follower transistor to a gate or gates of the part of said transfer gate field effect transistor, a first boost circuit for operatively generating a first boosted voltage above a power voltage at its output end, a second boost circuit for operatively generated a second voltage above said power voltage after the generation of said first boosted voltage in a write mode, means for applying said first boosted voltage to a drain of said source-follower transistor and means for applying said second boosted voltage to the drain of said source-follower transistor.

* * * * *

UNITED STATES PATENT AND TRADEMARK OFFICE
CERTIFICATE OF CORRECTION

PATENT NO. : 4,878,201

DATED : October 31, 1989

INVENTOR(S) : Kazuo Nakaizumi

It is certified that error appears in the above-identified patent and that said Letters Patent is hereby corrected as shown below:

Column 1, line 56, delete "nor", and insert --no--.

Column 4, line 11, delete "$eV_{cc}$", and insert --$V_{cc}$--.

Column 5, line 5, delete "features", and insert --featured--;
line 38, delete "WE", and insert --$\overline{WE}$--

Column 6, line 51, after "second", insert --boosted--.

Signed and Sealed this

Eighteenth Day of December, 1990

Attest:

HARRY F. MANBECK, JR.

*Attesting Officer*  *Commissioner of Patents and Trademarks*